United States Patent
Fields et al.

(10) Patent No.: US 6,223,326 B1
(45) Date of Patent: Apr. 24, 2001

(54) METHOD AND APPARATUS FOR ANALYZING PERFORMANCE AND DENSITY OF A SOURCE DESIGN MODULE FOR A TARGET PROGRAMMABLE GATE ARRAY

(75) Inventors: Carol A. Fields, Los Gatos; Timothy A. Tripp, San Jose, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/058,003

(22) Filed: Apr. 9, 1998

(51) Int. Cl.$^7$ .................................................. G06F 17/50
(52) U.S. Cl. .................................................................. 716/4
(58) Field of Search ........................... 395/500.37; 716/15

(56) References Cited

U.S. PATENT DOCUMENTS 6,002,861 * 12/1999 Butts et al. ..................... 395/500.37

OTHER PUBLICATIONS

"Synopsys (XSI)—Synthesis and Simulation Design Guide", 1997, available from Xilinx, Inc., 2100 Logic Drive, San Jose, CA 95124.

* cited by examiner

*Primary Examiner*—Matthew Smith
*Assistant Examiner*—Thuan Do
(74) *Attorney, Agent, or Firm*—LeRoy J. Maunu; Edel M. Young (57) ABSTRACT

A method and apparatus for analyzing performance and density of a source design module for a target programmable gate array. The source design module is converted to logic for a selected target programmable gate array. Performance and density of the converted logic are then estimated. If the estimated performance level does not achieve a target performance level, then problematic design elements are automatically or optionally converted to functionally equivalent programmable gate array design elements. The performance and density of the target programmable gate array is again estimated using the new design elements. In another mode of operation, design guidance is provided in converting the problematic design elements.

38 Claims, 6 Drawing Sheets

| IDENTIFIER | SUGGESTED ACTION | SELECTION(S) | | | | |
|---|---|---|---|---|---|---|
| Design element 1 | Suggestion 1 | [X] Automatic approximate conversion | [ ] Automatic approximate conversion | [X] Automatic approximate conversion | [ ] Assisted approximate conversion | [X] Assisted approximate conversion |
| Design element 2 | Suggestion 2 | | | | | |
| Design element 3 | Suggestion 3 | | | | | |
| Design element 4 | Suggestion 4 | | | | | |
| Design element 5 | Suggestion 5 | | | | | |

402

Continue    Cancel

METHOD AND APPARATUS FOR ANALYZING PERFORMANCE AND DENSITY OF A SOURCE DESIGN MODULE FOR A TARGET PROGRAMMABLE GATE ARRAY

FIELD OF THE INVENTION

The present invention generally relates to analysis of performance and density of logic design modules for integrated circuits, and more particularly to analysis of performance and density of logic designs for programmable gate arrays.

BACKGROUND OF THE INVENTION

Convincing designers to change from a known technology in which they have developed a repertoire of skills to a new technology where the designers' skill-sets are not developed can be challenging. This is the nature of the problem faced by vendors of programmable gate arrays when attempting to convince a buyer that a programmable gate array will meet the buyer's requirements.

Many target customers for programmable gate arrays are designers who presently have ASIC design modules suitable for their applications. The ASIC design modules were likely developed using methodologies and design tools suitable for ASICs. Problems arise in convincing the designers that programmable gate arrays are suitable alternatives to ASICs because an ASIC design module, while perhaps optimally designed for the selected ASIC technology using ASIC design methodologies, may not translate to a programmable gate array design module that satisfies a designer's requirements. Quite often, the reason that an ASIC design module cannot be quickly translated to a design for a programmable gate array that performs acceptably is that the ASIC design module includes ASIC coding and design styles that are not compatible with FPGA design practices. The ASIC design module may also include design elements, for example, adders and multipliers, that are specifically tailored for the ASIC. Oftentimes, in order to convince a designer that a programmable gate array is suitable, field engineers are required to assist in analyzing, redesigning, and determining the performance and gate density of the programmable gate array for a given design. This process may take days or weeks. The outcome of the process may also be dependent on the particular expertise of the field engineer.

Therefore, a method and apparatus that addresses the aforementioned problems is therefore desirable.

SUMMARY OF THE INVENTION

A method and apparatus for analyzing performance and density of a source design module for a target programmable gate array are provided in various embodiments of the invention. The source design module is converted to logic for a selected target programmable gate array. Performance and density of the converted logic are then estimated. If the estimated performance level does not achieve a target performance level, then problematic design elements are automatically converted to approximate functionally equivalent programmable gate array design elements. The performance and density of the target programmable gate array is again estimated using the new design elements. In another mode of operation, design guidance is provided in converting the problematic design elements.

In a first embodiment, a method is provided for analyzing performance of a source design module for a target programmable gate array. The method comprises the steps of: converting the source design module to an approximate functional equivalent programmable gate array design; estimating a first performance level of the programmable gate array using the programmable gate array design; if the first performance level does not achieve a target performance level, performing steps (a)–(c): (a) automatically converting problematic design elements to approximate functionally equivalent programmable gate array design elements; (b) estimating a second performance level of the programmable gate array using the programmable gate array design and converted ones of the design elements; and (c) reporting the second performance level.

In another embodiment, the invention is an apparatus for analyzing performance of a source design module for a target programmable gate array. The apparatus comprises: means for converting the source design module to an approximate functional equivalent programmable gate array design; means for estimating a first performance level of the programmable gate array using the programmable gate array design; means for automatically converting problematic design elements to approximate functionally equivalent programmable gate array design elements if the first performance level does not achieve a target performance level; means for estimating a second performance level of the programmable gate array using the programmable gate array design and converted ones of the design elements if the first performance level does not achieve a target performance level; and means for reporting the second performance level if the first performance level does not achieve a target performance level.

Another method for analyzing performance of a source design module for a target programmable gate array is provided in another embodiment. The method comprises the steps of: converting the source design module to an approximate functional equivalent programmable gate array design; estimating a first performance level of the programmable gate array using the programmable gate array design; comparing the first performance level of the programmable gate array to a target performance level; reporting a conversion success if the first performance level achieves the target performance level; if the first performance level does not achieve the target performance level, performing steps (a)–(e): (a) searching for problematic design elements in the source design module, the problematic design elements indicative of logic portions for which redesign is expected to result in a corresponding improvement in performance of the programmable gate array; (b) reporting the problematic design elements found in the source design module; (c) automatically converting selected ones of the problematic design elements to approximate functional equivalent programmable gate array design elements; (d) estimating a second performance level of the programmable gate array using the programmable gate array design and converted ones of the selected design elements; and (e) reporting the second performance level.

A system for analyzing performance of a source design module for a target programmable gate array is yet another embodiment of the invention. The system comprises: a synthesizer configured and arranged to convert the input source design module to an approximate functional equivalent programmable gate array design; a performance analyzer coupled to the synthesizer and configured and arranged to estimate performance of the programmable gate array design; a design analyzer configured and arranged to identify problematic design elements in the source design module; and a replacement generator coupled to the design analyzer and to the synthesizer and configured and arranged to automatically replace problematic design elements with approximate functionally equivalent programmable gate array design elements.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon seeing the following detailed description and upon reference to the drawing in which.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a variety of systems for analyzing performance of design modules for programmable gate arrays. The present invention has been found to be particularly applicable and beneficial in analyzing performance and density of an ASIC design module considered for deployment on a target programmable gate array. While the present invention is not so limited, an appreciation of the present invention is best presented by way of a particular example application, in this instance, in the context of providing assistance to a user in determining the suitability of using a programmable gate array to host a logic design.

Figure 1:
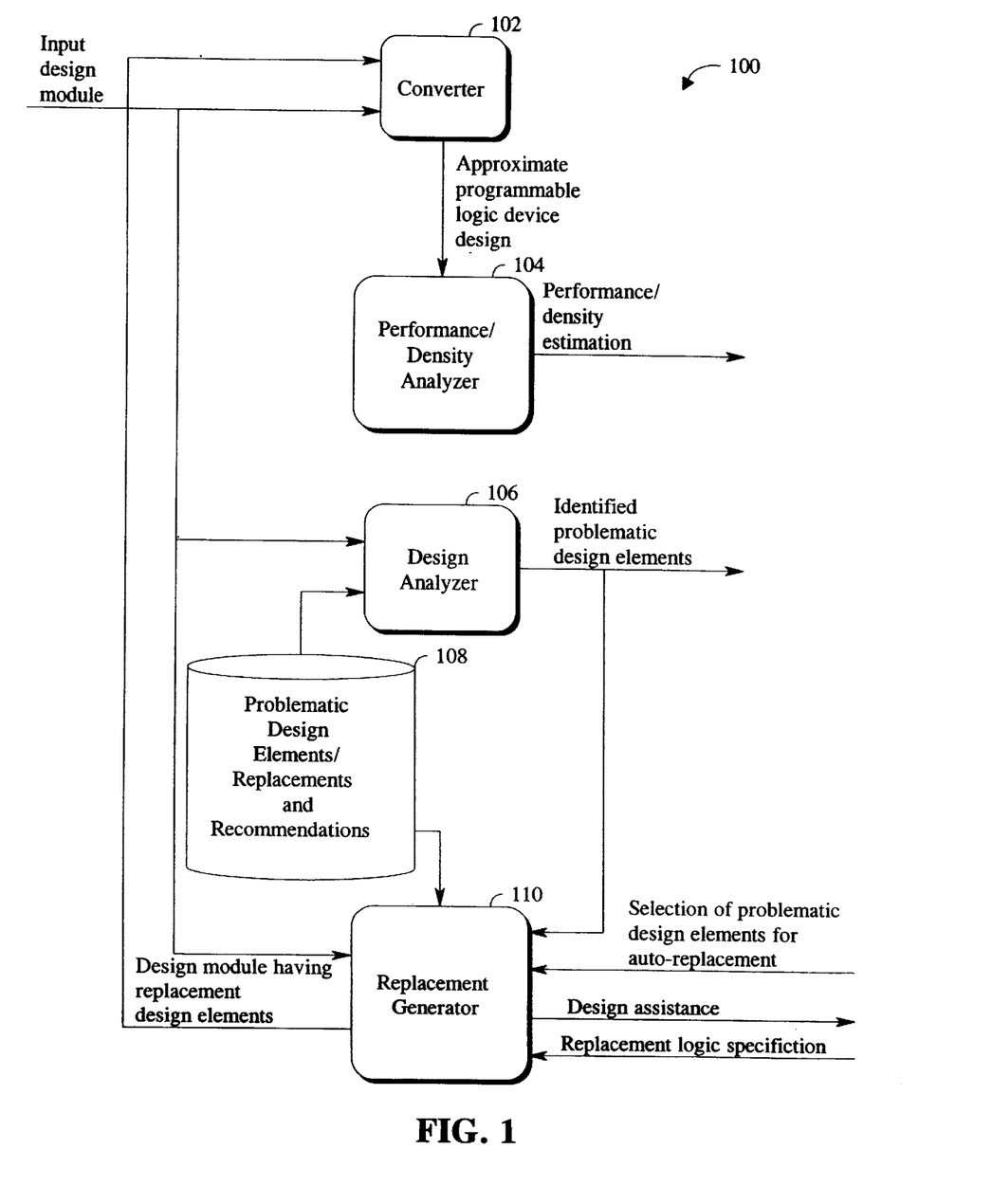
FIG. 1 is a functional block diagram of a system for determining the suitability of using a programmable gate array to host a logic design according to an example embodiment of the present invention.

FIG. 1 is a functional block diagram of a system for determining the suitability of using a programmable gate array to host a logic design according to an example embodiment of the present invention. The system 100 includes a converter 102, a performance/density analyzer 104, a design analyzer 106, a database 108 of problematic design elements and associated replacement logic and/or recommendations, and a replacement generator 110. While not explicitly shown, it will be appreciated that the converter 102, performance/density analyzer 104, design analyzer 106, database 108 and replacement generator 110 can be implemented as software executable on a conventional personal computer or workstation.

Converter 102 is a conventional synthesis tool, for example, for taking an input design module, such as for an ASIC, and synthesizing the design module for a target programmable gate array. The type of conversion depends upon the architecture of the target programmable gate array. An example programmable gate array is the XC4000 series Field Programmable Gate Array (FPGA) from XILINX. The output is an approximate synthesized design module that is provided as input to the performance/density analyzer 104.

Commercially available synthesizers and optimizers, such as those available from Simplicity, Synopsys, and Exemplar also provide the capability to analyze an input design module for performance and density. It will be appreciated that performance is customarily measured along a critical path that is either specified by a user or selected by the analysis tool. Performance is typically measured in nanoseconds or the inverse thereof, which is the clock speed. Density in this context is measured as the number of gates per die. Analyzer 104 provides as output an estimate of the performance and density levels.

The input design module is also provided as input to design analyzer 106. Design analyzer 106 processes the input design module to identify instances of problematic design elements. Example problematic design elements include arithmetic logic cores, state machines, clock buffers, certain logic coding styles, global tri-state logic, global set/reset logic, RAM logic, timing constraints, counters, logic cores, decoders, alignment of logic hierarchy, and long equations. It will be appreciated that the design analyzer can be modified to detect instances of other types of problematic design elements. A database 108 is used for the purpose of having a repository of certain example problematic design elements against which the analyzer 106 can compare elements found in the input design module. For example, database 108 includes examples of coding styles found to be inefficient based on past experience. Database 108 also includes example counters coded in, for example, Verilog or VHDL.

Replacement code elements and/or recommendations are associated with the problematic design elements in database 108. The replacements and recommendations are provided as input to replacement generator 110 along with the detected ones of the problematic design elements from design analyzer 106. Replacement generator 110 operates in two modes. In the first mode, certain problematic design elements are automatically replaced with suitable alternatives. In the second mode, the replacement generator 110 provides design assistance to a user. Given the assistance provided by the replacement generator 110, the user can then recode the problematic design or select replacement code depending upon the type of design element.

After replacing the desired problematic design elements, replacement generator 110 provides the updated design module back as input to converter 102 for synthesis. Performance/Density analyzer 104 then estimates the performance and density of the new design and provides the results as output.

Figure 2:
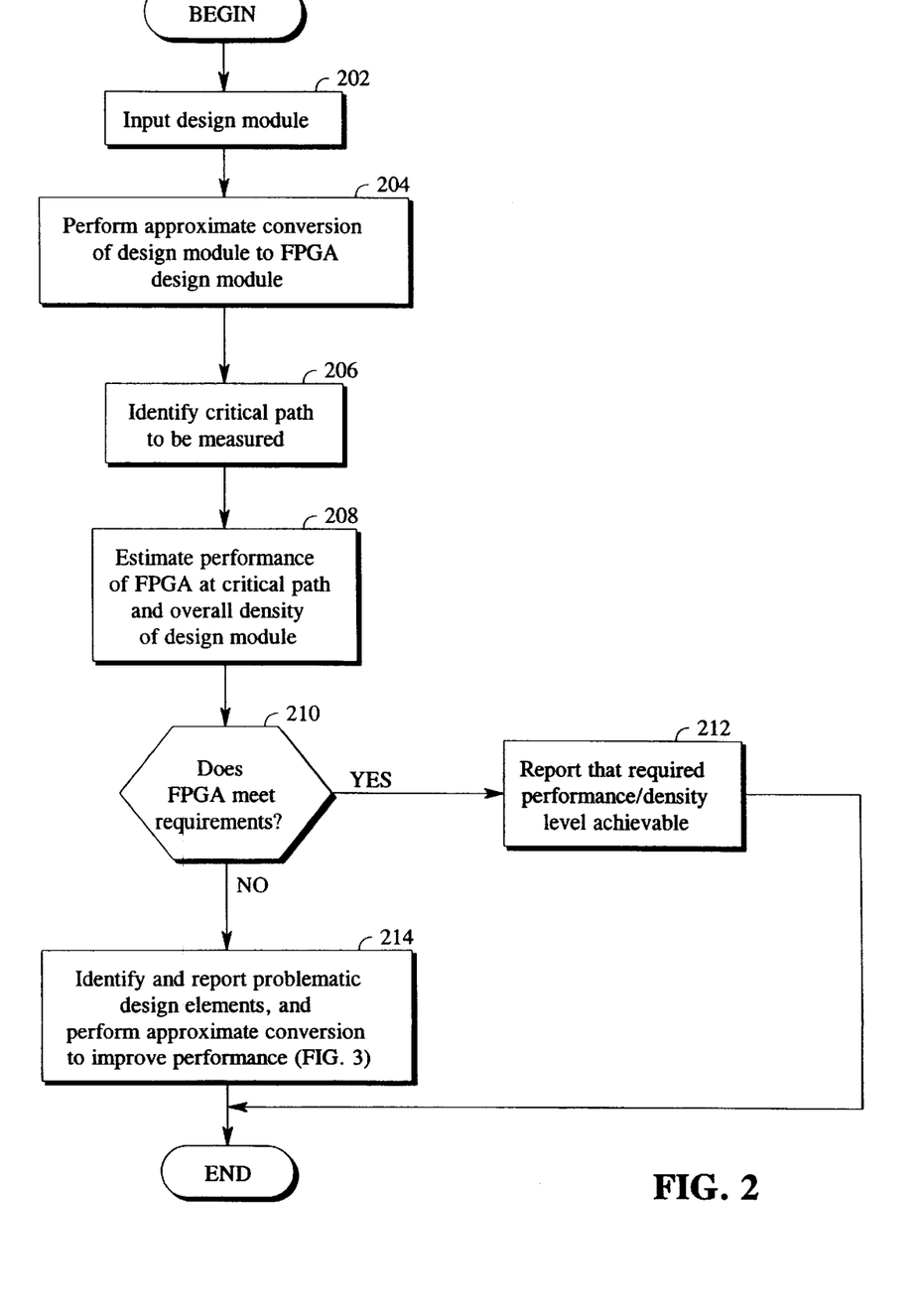
FIG. 2 is a flow chart of an example method according to one embodiment of the invention.

FIG. 2 is a flow chart of an example method according to one embodiment of the invention. In general, the method shown in FIG. 2 takes as input a logic design module, converts the design module to an approximately equivalent field programmable gate array (FPGA) design module, estimates performance and density achievable with the FPGA design module, and either reports that the FPGA design meets predetermined performance/density requirements or identifies and assists in modifying problematic design elements in the logic design module, wherein the problematic design elements are those that are likely to negatively impact the performance and density levels achievable when the design modules are deployed on an FPGA.

Beginning now at block 202, a design module is input for analysis. The design module may be an ASIC design module or alternatively, an implementation of an application on an FPGA. An approximate conversion of the design module is performed at block 204. To perform an approximate conversion, the method examines the different design elements in the module, for example, global set and reset pins and others identified in FIGS. 5 and 6, and determines whether a full conversion is required or whether a suitable timing estimate can be taken from a database (not shown). The suitable estimate may be a timing estimate based on an accumulation of prior designs or may be based on an algorithm that uses associated design statistics. For example, the design elements are considered as to whether it would be difficult or easy to perform a full conversion on the element. In the case of global set and reset elements, since a conversion is relatively straightforward, the elements are fully converted to an FPGA design element. Another way to approximate a conversion of a design module to an FPGA design is to perform a partial synthesis or partial place-and-route with conventional design tools.

In the example approximate conversion, some accuracy is sacrificed in order to quickly come to a determination as to whether the performance and density requirements are achievable on an FPGA. Specifically, the conventional way to determine precise performance/density measurements for a design is to completely place-and-route the design, which can take a relatively long period of time. However, designers may not have the option of spending the time required to obtain such an accurate measurement when evaluating different technologies. Therefore, the example method only partially synthesizes or places-and-routes the design module.

At block 206, the critical path of the design module from which performance and density will be estimated is identified. Example tools, such as RTL Analyzer from Synopsys and HDL Analyst from Simplicity provide the capability to specify a critical path, and from that critical path, estimate performance and gate density of the design module as shown at block 208.

If based on the approximate conversion and performance/density estimates for the FPGA design, predetermined performance/density requirements are achieved, block 210 directs control to block 212. The performance/density analyzer 104 reports that the required performance/density parameters are likely to be achievable using an FPGA.

However, if the predetermined performance/density requirements are not achieved, block 210 directs control to block 214. As shown in block 214 and further described in FIG. 3, problematic design elements are identified and reported. In addition, selected ones of the problematic design elements are converted and the performance and density are re-estimated.

Figure 3:
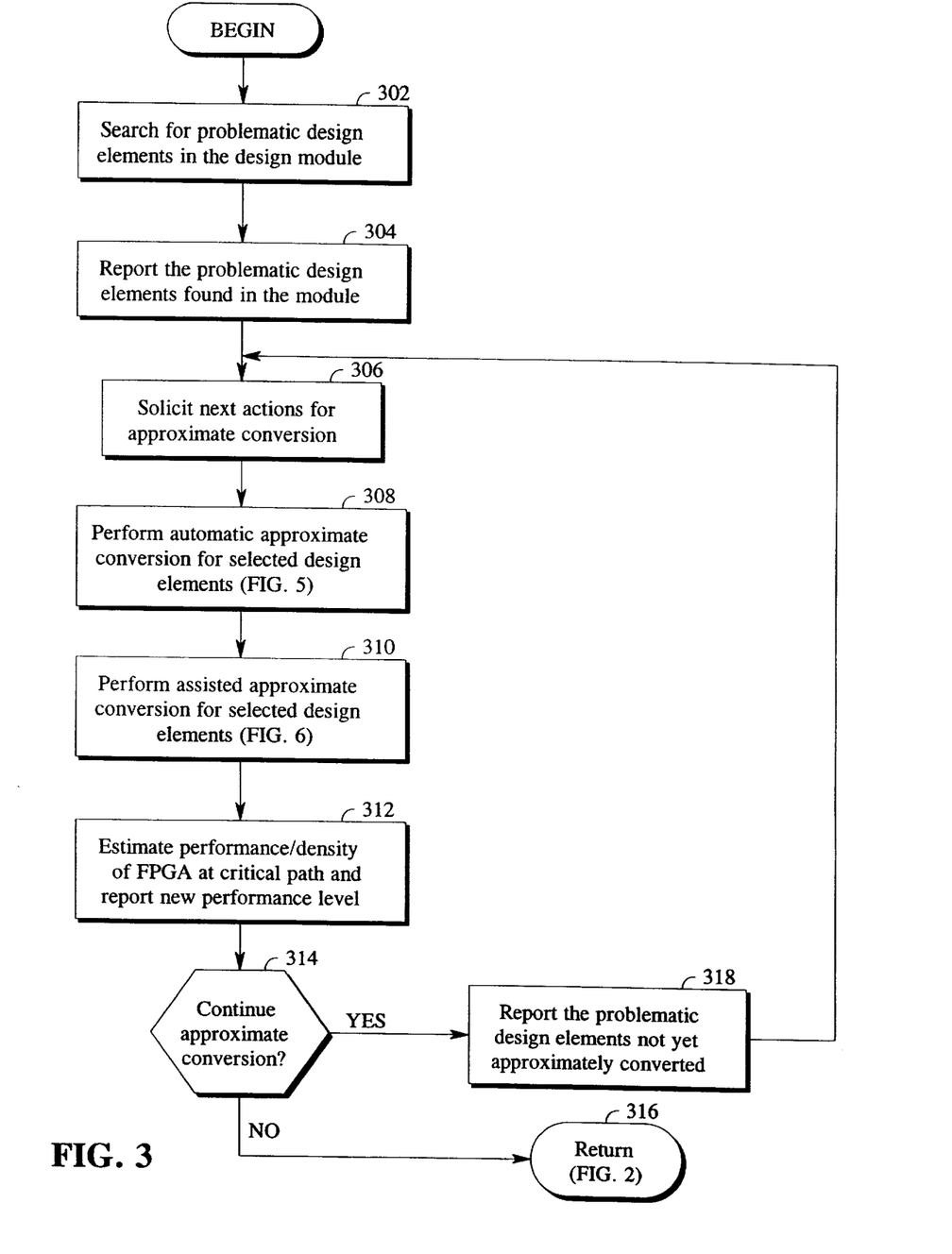
FIG. 3 is a flow chart of an example method for identifying problematic design elements, approximating conversion of the design elements to logic that is more likely to provide the desired performance and density levels, and therefrom estimate the performance and density.

Continuing now with FIG. 3, a method is shown for identifying problematic design elements, approximating conversion of the design elements to logic that is more likely to provide the desired performance and density levels, and therefrom estimate the performance and density. Beginning now at block 302, the design analyzer takes as input a logic design module and searches for problematic design elements. Reference is made to "Synopsys HDL Synthesis and Simulation Design Guide" published by XILINX for example problematic design elements for which a search can be performed in a logic design module. At block 304, the problematic design elements are reported in the order of decreasing negative impact on performance and density. That is, the design elements with the greatest negative impact on performance and density are reported first.

Figure 4:
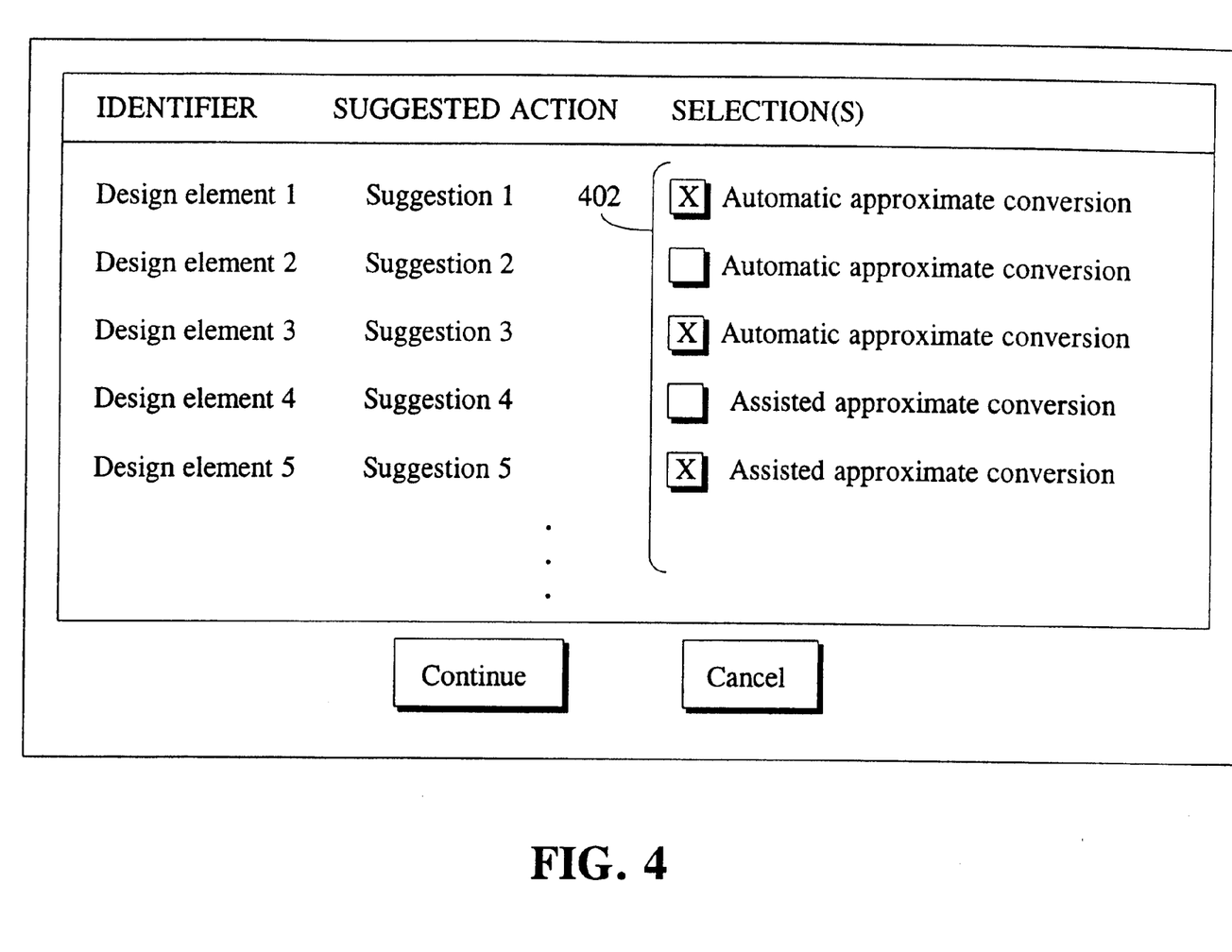
FIG. 4 is an example display screen layout for reporting problematic design elements and providing assistance in converting the same.

Continuing now at block 306, the method solicits the next actions to perform for the approximate conversion. After having reported the problematic design elements, for example, in the format of the display screen of FIG. 4, the design elements for which conversion is desired are selected for conversion. In one embodiment, certain ones of the problematic design elements may be automatically selected for conversion according to preset criteria, and in another embodiment, the selection may be entirely left to the discretion of the user. For preselected elements, the associated ones of the check boxes 402 are automatically marked. Others may be selected with, for example, a mouse.

In the example embodiment, there are two modes for approximately converting problematic design elements. A first conversion mode automatically performs an approximate conversion of the selected design elements. Example problematic design elements for which an automatic approximate conversion is possible include arithmetic logic cores, state machines, clock buffers, and certain logic coding styles. The second conversion mode provides assistance to the user to make the conversion. Example problematic design elements for which assisted conversion is performed include global tri-state logic, global set/reset logic, RAM logic, constraints, counters, logic cores, decoders, alignment of logic hierarchy, long equations, and certain coding styles. At block 308, the selected ones of the problematic design elements eligible for automatic conversion are automatically converted, and at block 310, assisted conversion of the selected ones of the design elements is performed.

After the desired approximate conversions are complete, performance and density of the design modules are again estimated as shown at block 312. If the performance and density requirements are met or no further conversion is desired, block 314 directs control to block 316 to complete the processing. Otherwise, control is directed to block 318, wherein problematic design elements that have not been converted are reported so that further approximate conversion can be performed.

Figure 5:
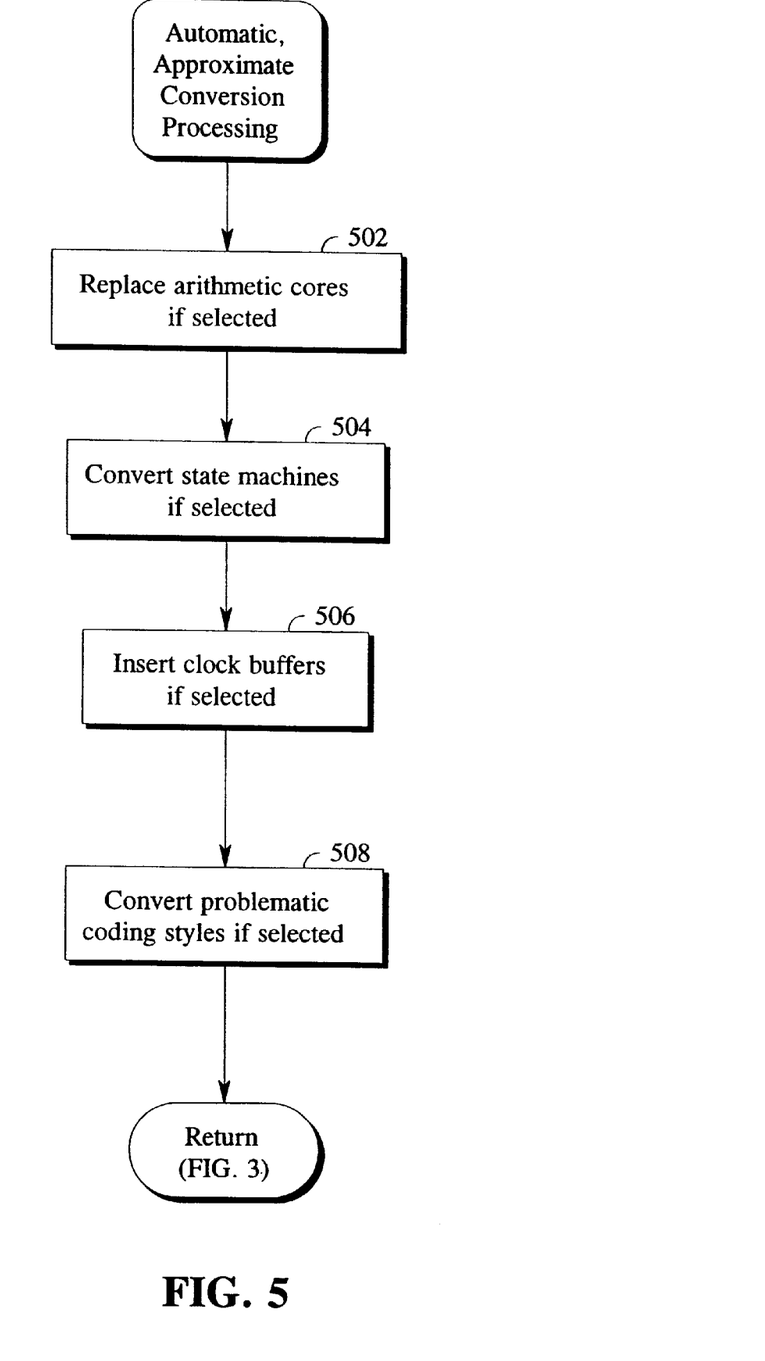
FIG. 5 is a flow chart of an example method for automatically and approximately converting problematic design elements to logic that is likely to provide better performance and density.

FIG. 5 is a flow chart of an example method for automatically and approximately converting problematic design elements to logic that is likely to provide better performance and density. At block 502, certain arithmetic logic cores, for example, adders, multipliers, subtractors, accumulators, etc. are considered for conversion. For example, if the arithmetic cores are not from a core library especially suited for the target FPGA, the cores can be replaced with respectively associated cores from an appropriate library, for example a XILINX core library for its FPGAs.

At block 504, state machines of the source design modules are converted to those appropriate for the target FPGA. It will be appreciated that commercially available synthesis tools, such as FPGA Express from Synopsys, provide this function.

For clock buffers, the method determines how many clocks are present in the system. For example, all the nets and/or signals that use a particular clock input/output pin (I/O) or flip-flop are identified. The pins and/or flip-flops having the greatest number of nets and/or signals are identified and appropriate global clock buffers are hard-coded onto the I/Os. The global clock buffers can be obtained, for example, from a logic library for the target FPGA. Certain other coding styles, such as using pipelining, are automatically converted to suitable logic for the target FPGA at block 508.

Figure 6:
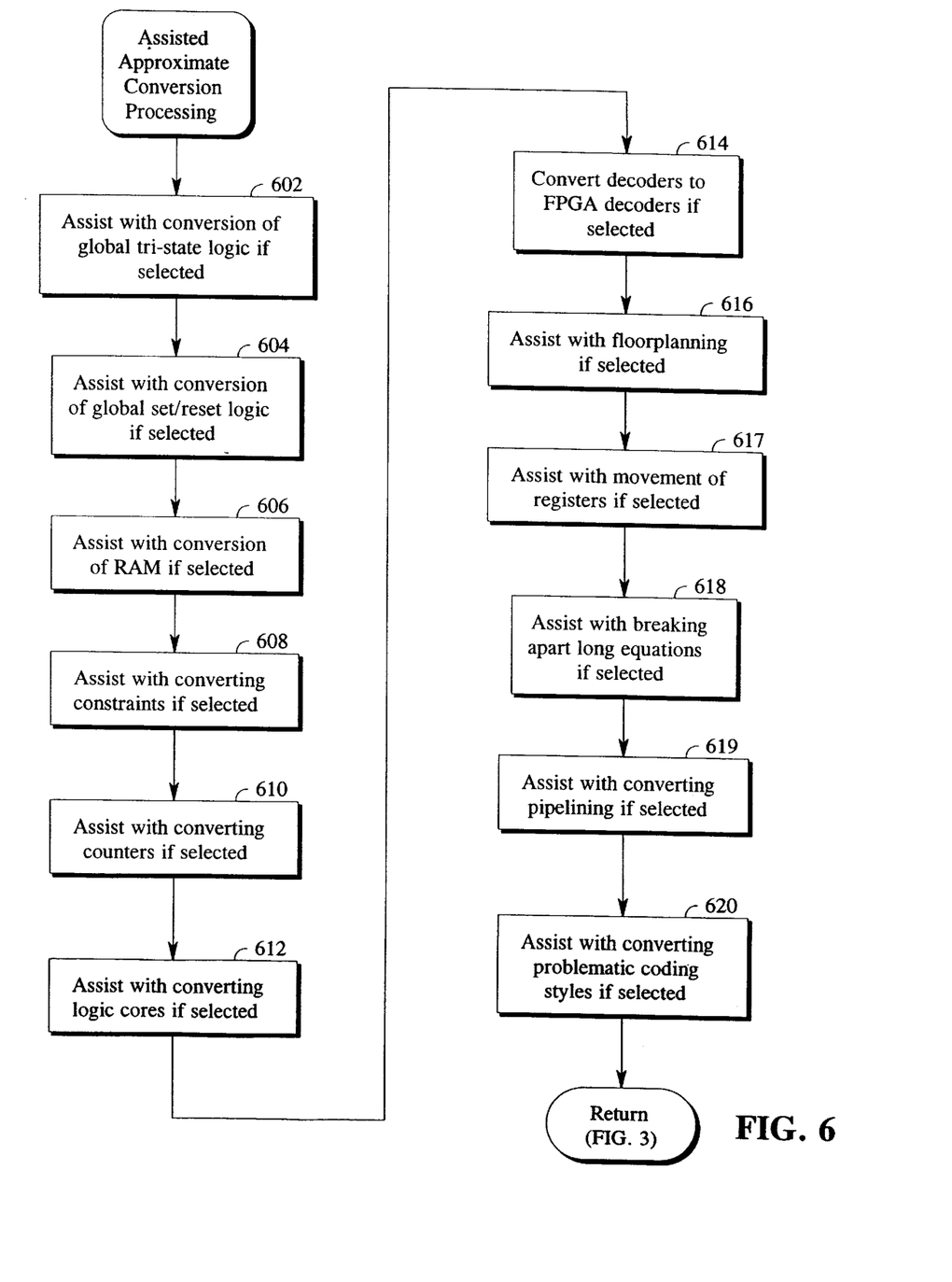
FIG. 6 is a flow chart of an example method for providing assistance in converting problematic design elements to logic that is likely to provide the desired performance and density levels.

FIG. 6 is a flow chart of an example method for providing assistance in converting problematic design elements to logic that is likely to provide the desired performance and density levels. At block 602, assistance is provided for converting global tri-state logic. If a signal is detected that is routed to all the tri-state pins of the design, the user is asked whether usage of the dedicated global tri-state pin of the FPGA is suitable. If so, the interconnects are removed and the signal is routed to the global tri-state pin of the FPGA.

The assisted global set/reset conversion is initiated at block 604 for signals that are routed to a majority of the global set/reset logic of the input design module. This conversion may be fully automated or performed in an assisted mode. If a signal is detected that is routed to every flip-flop and register of the design, the signal can be replaced with the global set/reset pin of the target FPGA, and all the other interconnects for the signal can be removed. For signals that are only routed to the majority of flip-flops and registers, the designer is asked whether the other flip-flops (those not receiving the signal) can tolerate being set or reset at the assertion of the signal.

At block 606, assistance is provided for converting RAM in the input design module to RAM for the target FPGA. In the example embodiment, the input design module is scanned for logic used as memory elements, such as flip-flops. The identified memory elements are presented to the user, and if the user verifies that the logic is being used as memory, an option is then provided to select using an FPGA look-up table for the memory elements instead of using the flip-flops.

Assistance with converting timing constraints is provided at block 608. In many example design modules, too many timing constraints are used, while in other designs too few timing constraints are used. Appropriate setting of timing constraints is very dependent upon the synthesis tool and nature of the design. In an example embodiment, a graphical user interface is used to indicate how modules can be grouped and timing constraints can be specified that are more efficient than those present in the input design module.

At block 610, assistance is provided to convert counters. Counters are much more efficiently implemented in FPGAs if the counters make use of the fast carry chain of the FPGA. But the converter must recognize that certain logic actually comprises a counter. Counters are relatively difficult to detect in a design because they don't use a recognizable operator such as "+" or "&". Certain synthesis tools will implement counters in a specified way. Therefore, along with the input design module, it is desirable to identify the original synthesis tool for the design module so that counters can be identified. Alternatively, code in the input design module that resembles a counter is flagged for a user, and the user is asked whether the code implements a counter and whether the counter can be replaced with a recommended arithmetic module.

For assisted conversion of more complex logic cores, for example, DSP logic cores, PCI logic cores, and others, the user is asked whether these logic cores are present, and an indication is provided that the target FPGA library includes logic cores that implement the referenced functionality, as shown at block 612. Along with the indication is an estimate of the performance and density of the logic from the library of the target FPGA. The user can then selectively replace logic cores from the input design with those from the library of the target FPGA.

At block 614, decoders found in the input design module are flagged for the user. The user is presented with the option to convert the decoders to, for example, FPGA edge decoders such as those available in the XILINX XC4000 series FPGAs.

The input design module is further processed to determine how the design has been partitioned and optimized, as shown at block 616. Based on the partitioning, recommendations are made to group together modules that are too small, or to break apart groups where the logic is unrelated and the logic causes routing congestion. After changing the partitioning, the design module is then re-optimized. The input design module is also processed to determine how the modules are broken, where the modules are placed, and how they are optimized. Repeating placement and routing is then recommended along with suggestions for alternative partitioning, placement, and optimization. If there are registers in the design module, recommendations are made regarding placement of the registers into I/O blocks rather than into CLBs, as shown by block 617. Alternatively, because the process to change the placement of registers can be lengthy, an estimate of the expected percentage improvement can be provided instead.

At block 618, the method identifies long equations in the input design module and flags them for the user. The user then has the option of electing to break apart the equation or leave the equation as is. To identify such long equations, the method searches for combinatorial logic in the critical path that extends many levels through combinatorial logic blocks (CLBs).

Logic directed to pipelining is identified for the user at block 619. The user can then manually recode the logic based on example recommendations.

Various VHDL and Verilog coding styles that are likely to reduce performance and/or density and that are present in the input design module are identified for the user at block 620. Example recommendations are then presented to the user, and the user can either elect to manually recode the elements or leave the design elements as they are.

Note that the flow charts show a long series of steps without branching. Preferably, the flow is followed this way from beginning to end, with the user implementing as many modifications as desired. The design module having replacement design elements is then converted as shown in FIG. 1. However, in another embodiment, the user can shortcut the process, either beginning at a midpoint in the flow or stopping at a midpoint in the flow.

Accordingly, the present invention provides, among other aspects, a method and apparatus for analyzing performance and density of a logic design module to be hosted by a programmable gate array. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for analyzing performance of a source design module for a target programmable gate array, wherein the source design module is developed for a first device that is different from the programmable gate array, comprising the steps of:

converting the source design module to an approximate functional equivalent programmable gate array design;

estimating a first performance level of the programmable gate array using the programmable gate array design;

if the first performance level does not achieve a target performance level, performing steps (a)–(c);

(a) automatically converting problematic design elements to approximate functionally equivalent programmable gate array design elements;

(b) estimating a second performance level of the programmable gate array using the programmable gate array design and converted ones of the design elements; and (c) outputting the second performance level.

2. The method of claim 1, further comprising the step of repeating steps (a)–(c) until the second performance level achieves the target performance level.

3. The method of claim 1, further comprising the steps of:

estimating a first density level of the programmable gate array using the programmable gate array design;

if the first density level does not achieve a target density level, performing steps (e)–(g):

(e) automatically converting problematic design elements to approximate functionally equivalent programmable gate array design elements;

(f) estimating a second density level of the programmable gate array using the programmable gate array design and converted ones of the design elements; and (g) reporting the second density level.

4. The method of claim 1, further comprising the step of providing assistance in conversion of selected ones of the problematic design elements to approximate functional equivalent programmable gate array design elements.

5. The method of claim 1, further comprising the step of automatically converting arithmetic logic elements from the source design module to optimized arithmetic elements for the target programmable gate array.

6. The method of claim 1, further comprising the step of automatically converting state machines from the source design module to optimized state machines for the target programmable gate array.

7. The method of claim 1, further comprising the step of automatically converting clock buffers from the source design module to optimized clock buffers for the target programmable gate array.

8. The method of claim 1, further comprising the step of providing assistance in converting global tri-state logic of the source design module to optimized global tri-state logic for the target programmable gate array.

9. The method of claim 1, further comprising the step of providing assistance in converting global set/reset logic of the source design module to optimized global set/reset logic for the target programmable gate array.

10. The method of claim 1, further comprising the step of providing assistance in converting memory logic of the source design module to optimized memory logic for the target programmable gate array.

11. The method of claim 1, further comprising the step of providing assistance in converting timing constraints of the source design module to optimized timing constraints for the target programmable gate array.

12. The method of claim 1, further comprising the step of providing assistance in converting counters of the source design module to optimized counters for the target programmable gate array.

13. The method of claim 1, further comprising the step of providing assistance in converting predetermined logic cores of the source design module to optimized predetermined logic cores for the target programmable gate array.

14. The method of claim 1, further comprising the step of providing assistance in converting decoders of the source design module to optimized decoders for the target programmable gate array.

15. The method of claim 1, further comprising the step of providing assistance in hierarchically realigning logic in the source design module.

16. The method of claim 1, further comprising the step of, for a logic equation in the source design module that is greater than a predetermined length, providing assistance in replacing the logic equation with a plurality of functionally equivalent logic equations.

17. An apparatus for analyzing performance of a source design module for a target programmable gate array, wherein the source design module is developed for a first device that is different from the programmable gate array, comprising:

means for converting the source design module to an approximate functional equivalent programmable gate array design;

means for estimating a first performance level of the programmable gate array using the programmable gate array design;

means for automatically converting problematic design elements to approximate functionally equivalent programmable gate array design elements if the first performance level does not achieve a target performance level;

means for estimating a second performance level of the programmable gate array using the programmable gate array design and converted ones of the design elements if the first performance level does not achieve a target performance level; and means for outputting the second performance level if the first performance level does not achieve a target performance level.

18. The apparatus of claim 17, further comprising:

means for estimating a first density level of the programmable gate array using the programmable gate array design;

means for automatically converting problematic design elements to approximate functionally equivalent programmable gate array design elements if the first density level does not achieve a target density level;

means for estimating a second density level of the programmable gate array using the programmable gate array design and converted ones of the design elements if the first density level does not achieve a target density level; and means for outputting the second density level.

19. The apparatus of claim 17, further comprising means for providing assistance in conversion of selected ones of the problematic design elements to approximate functional equivalent programmable gate array design elements.

20. The apparatus of claim 17, further comprising means for automatically converting arithmetic logic elements from the source design module to optimized arithmetic elements for the target programmable gate array.

21. The apparatus of claim 17, further comprising means for automatically converting state machines from the source design module to optimized state machines for the target programmable gate array.

22. The apparatus of claim 17, further comprising means for automatically converting clock buffers from the source design module to optimized clock buffers for the target programmable gate array.

23. The apparatus of claim 17, further comprising means for providing assistance in converting global tri-state logic of the source design module to optimized global tri-state logic for the target programmable gate array.

24. The apparatus of claim 17, further comprising means for providing assistance in converting global set/reset logic of the source design module to optimized global set/reset logic for the target programmable gate array.

25. The apparatus of claim 17, further comprising means for providing assistance in converting memory logic of the source design module to optimized memory logic for the target programmable gate array.

26. The apparatus of claim 17, further comprising means for providing assistance in converting timing constraints of the source design module to optimized timing constraints for the target programmable gate array.

27. The apparatus of claim 17, further comprising means for providing assistance in converting counters of the source design module to optimized counters for the target programmable gate array.

28. The apparatus of claim 17, further comprising means for providing assistance in converting predetermined logic cores of the source design module to optimized predetermined logic cores for the target programmable gate array.

29. The apparatus of claim 17, further comprising means for providing assistance in converting decoders of the source design module to optimized decoders for the target programmable gate array.

30. The apparatus of claim 17, further comprising means for providing assistance in hierarchically realigning logic in the source design module.

31. The apparatus of claim 17, further comprising means for providing assistance in replacing a logic equation that is greater than a predetermined length in the source design module with a plurality of functionally equivalent logic equations.

32. A method for analyzing performance of a source design module for a target programmable gate array, wherein the source design module is developed for a first device that is different from the programmable gate array, comprising the steps of:
   converting the source design module to an approximate functional equivalent programmable gate array design;
   estimating a first performance level of the programmable gate array using the programmable gate array design;
   comparing the first performance level of the programmable gate array to a target performance level;
   outputting a conversion success indicator if the first performance level achieves the target performance level;
   if the first performance level does not achieve the target performance level, performing steps (a)–(e);
      (a) searching for problematic design elements in the source design module, the problematic design elements indicative of logic portions for which redesign is expected to result in a corresponding improvement in performance of the programmable gate array;
      (b) reporting the problematic design elements found in the source design module;
      (c) automatically converting selected ones of the problematic design elements to approximate functional equivalent programmable gate array design elements;
      (d) estimating a second performance level of the programmable gate array using the programmable gate array design and converted ones of the selected design elements; and
      (e) outputting the second performance level.

33. The method of claim 32, further comprising the step of repeating steps (c)–(e) until the second performance level achieves the target performance level.

34. The method of claim 32, wherein the reporting step (b) includes the step of outputting the problematic design elements found in the ASIC logic design ordered by relative levels of performance improvement expected to be attainable by redesign.

35. The method of claim 32, further comprising the step of providing assistance in conversion of selected ones of the problematic design elements to approximate functional equivalent programmable gate array design elements.

36. The method of claim 32, further comprising the steps of:
   estimating a first density level of the programmable gate array using the programmable gate array design;
   comparing the first density level of the programmable gate array to a target density level;
   outputting a conversion success indicator if the first density level achieves the target density level;
   if the first density level does not achieve the target density level, performing steps (f)–(j);
      (f) searching for problematic design elements in the source design module, the problematic design elements indicative of logic portions for which redesign is expected to result in a corresponding improvement in density of the programmable gate array;
      (g) outputting the problematic design elements found in the source design module;
      (h) automatically converting selected ones of the problematic design elements to approximate functional equivalent programmable gate array design elements;
      (i) estimating a second density level of the programmable gate array using the programmable gate array design and converted ones of the selected design elements; and
      (j) outputting the second density level.

37. A system for analyzing performance of a source design module for a target programmable gate array, comprising:
   a synthesizer configured and arranged to convert the input source design module to an approximate functional equivalent programmable gate array design;
   a performance analyzer coupled to the synthesizer and configured and arranged to estimate performance of the programmable gate array design;
   a design analyzer configured and arranged to identify problematic design elements in the source design module; and
   a replacement generator coupled to the design analyzer and to the synthesizer and configured and arranged to automatically replace problematic design elements with approximate functionally equivalent programmable gate array design elements if an estimated performance level of the programmable gate array design does not achieve a target performance level.

38. The system of claim 37, further comprising a database coupled to the design analyzer and to the replacement generator and having predetermined problematic design elements and associated replacement design elements.

* * * * *